United States Patent [19]

Wilmanns

[11] 4,024,291
[45] May 17, 1977

[54] CONTROL OF VAPOR DEPOSITION

[75] Inventor: Ingo Wilmanns, Gelsdorf, Germany

[73] Assignee: Leybold-Heraeus GmbH & Co. KG, Cologne, Germany

[22] Filed: Sept. 21, 1976

[21] Appl. No.: 728,833

Related U.S. Application Data

[63] Continuation of Ser. No. 587,501, June 17, 1975, abandoned.

[52] U.S. Cl. .................................... 427/10; 118/8; 118/49; 427/166
[51] Int. Cl.² ........................................ C23C 13/04
[58] Field of Search ............... 118/7, 8, 4, 48–49.5; 427/8–10, 69, 70, 91, 99, 109, 124, 166, 167, 50–52, 237, 248–253, 255; 330/1 A, 10

[56] References Cited

UNITED STATES PATENTS

| | | | |
|---|---|---|---|
| 2,338,234 | 1/1944 | Dimmick | 427/10 |
| 2,936,732 | 5/1960 | Ring et al. | 427/10 |
| 2,978,364 | 4/1961 | Blaustein | 427/10 |
| 3,059,611 | 10/1962 | Fury et al. | 118/8 |

Primary Examiner—Morris Kaplan
Attorney, Agent, or Firm—Joseph F. Padlon

[57] ABSTRACT

An arrangement for regulating the vapor deposited layer build-up in the production of deposited optically active thin layers on substrates in a vacuum. The optical characteristics of the deposited layer are measured continuously and the measurements are converted into proportional electrical signals. These signals are differentiated twice, with the second derivative serving to provide the zero-axis crossings of the signals. The vapor deposition process is interrupted dependent on the zero-axis crossings.

4 Claims, 1 Drawing Figure

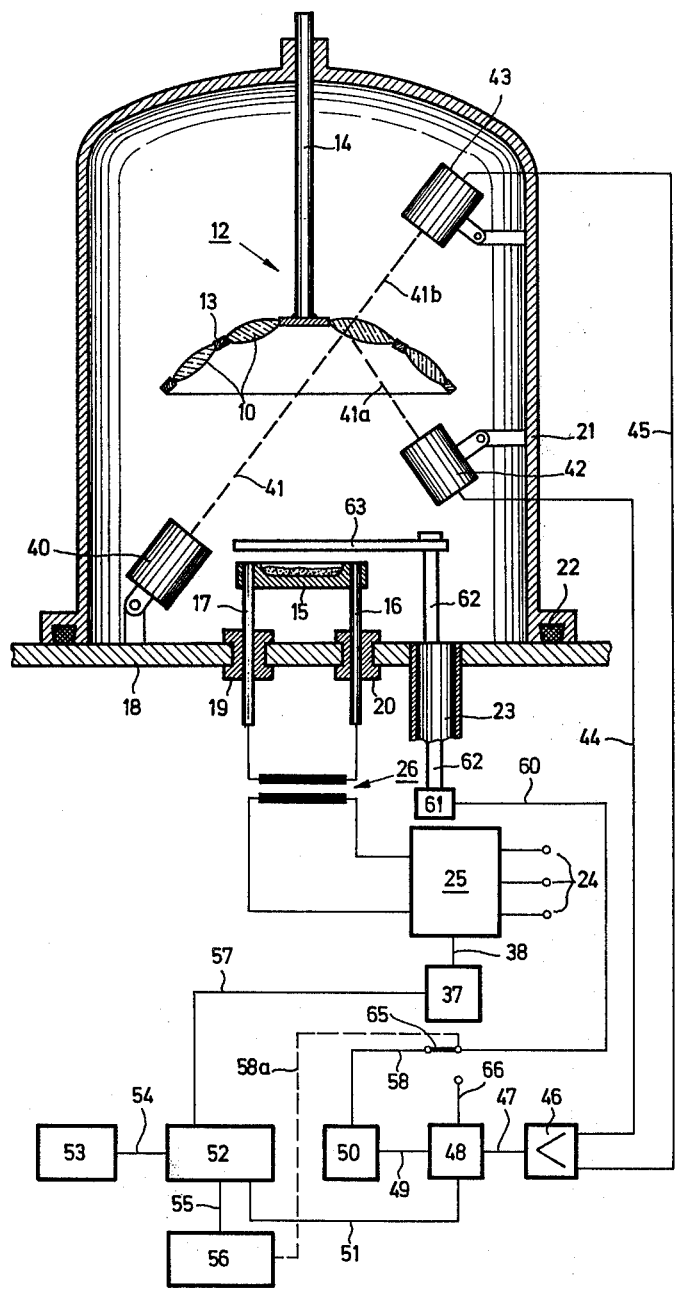

CONTROL OF VAPOR DEPOSITION

CROSS REFERENCE TO RELATED APPLICATION

This is a continuation of a parent application Ser. No. 587,501, filed June 17, 1975, now abandoned, in the name of Dr. Ingo Wilmanns entitled "AN ARRANGEMENT FOR REGULATING THE LAYER BUILD-UP IN THE PRODUCTION OF OPTICALLY THIN LAYERS".

BACKGROUND OF THE INVENTION

The present invention relates to an arrangement for regulating the layer build-up in the production of optically active thin layer in a vacuum on substrates. Continuous measurement is applied of the optical behavior of the deposited layer. The optical behavior is converted into proportional electrical signals and these signals are subjected to differentiation.

In the present application, "optical behavior" means the influence on the amplitude, phase and spectral dependence of the light used for measurement by the associated layer. When deposited, the characteristics of optically active layers change, e.g., transmission, reflection, phase and polarization state of the measurement light. These effects may be used for measurement or test purposes to the extent described below.

From the German disclosure DT-AS No. 1,548,262 it is already known in the art how to determine the transmission or reflection behavior of the deposited layer by means of a light beam or a pencil of light. The result of such measurement is generally used to interrupt the evaporation process after attaining certain layer properties. However, a very exact interruption of the evaporaton process is not possible, since the obtaining and evaluation of the test results and the interruption of the vapor flow is affected by a time difference so that subsequent growth of the layer cannot be prevented with certainty.

From the German disclosure DT-AS No. 1,214,970 it is further known how to keep track of the layer build-up as a function of time and how to interrupt the evaporation process by observing the transmission of reflection behavior of monochromatic light continuously, and counting the maximums and minimums. The number of maximums or minimums, depending on the wavelength of the light used, gives a clue as to the thickness of the layer. The above publications suggest that, to determine exactly the maximums and minimums, the maximums and minimums of a certain section of the curve be determined by means of a differentiation circuit already known in the art. However, the known conventional arrangement can be used only for those layers having a quarter-wavelength of the measurement light used, or an integral multiple thereof. It is a measurement and regulating procedure for so-called $\lambda/4$ layers.

The concept "optically active layers" within the context of the present applications includes all layers which change the optical properties of the substrate. They may, for example, be reflection reducing layers, filter layers on lenses and other glasses which reflect or transmit part of the electromagnetic radiation in the visible and/or invisible part of the spectrum. The wavelength range of interest in the present invention extends from ultraviolet to the far infrared. The optical activity concerns above all low-loss amplitude changes of the reflected or transmitted radiation. It also includes layers which change the phase or polarization state of the light used for measurement.

Optically active layers may have both a homogeneous composition or, in the individual layer, non-homogeneous composition. They may also consist of a combination of many layers of low and high refraction, as are encountered, for example, with the so-called interference filters. These interference filters have the remarkable property that they extensively compensate errors in the thickness of individual layers as long as the individual layers have the optical thickness of quarter-wavelengths of the light used for the measurement or multiples thereof. However, this requires that the subsequent layer grows together with the preceding until the desired properties are attained. Hence, not the properties of the individual layer, but the effect of the totality of the layers is decisive as to the effect achieved. From this follows that especially multiple layers of the type described, can be produced only by the application of optical measurement methods, — not mechanical methods — with the desired close tolerances.

In view of the overall properties of optically active thin layers, recently increasingly tight tolerances have been required. This assumes that the production process for these layers is to a high degree reproducible, in order to obtain with equal success layers of constant quality. This applies not only to the numerous surface layers of complex optical systems, but also to spectacle lenses, especially sunglass lenses. It is self-understood that, for example, in the case of breakage of a spectacle lens, a lens with different optical properties cannot be considered. Color differences in particular are not permissible.

For certain layer combinations, as used, say, for wideband reflection elimination layers, not only layer thicknesses which are integral multiples of quarter-wavelengths are of interest, but also those whose thickness is a multiple of $\lambda/8$.

It is, therefore, an object of the present invention to provide an arrangement of the initially described type in which $\lambda/8$ layers of high reproducibility of all properties can be obtained with simple operation of the evaporation device.

Another object of the present invention is to provide an arrangement of the foregoing character which is simple in design and construction, and which does not require skilled scientific personnel to operate.

A still further object of the present invention is to provide an arrangement, as described, which has a long operating life and may be maintained in service economically.

SUMMARY OF THE INVENTION

The objects of the present invention are achieved by providing that the differentiated signal is subjected to a second differentiation where the zero-axis crossings are located and are used to interrupt the evaporation process. The interruption of the evaporation process can be accomplished in two ways. One, the zero-axis crossing is used to interrupt the energy supply to the evaporater. This method is particularly simple and effective in connection with evaporators having extremely low inertia during the vapor generation. Among these are electron beam evaporators where the electron beam directly hits (impacts) the evaporation material. However, the procedure in accordance with the present invention can also be used to advantage with the so-called thermic evaporator which have a certain inertia because of the stored heat. In this case, it is provided in accordance with the present invention, to use the zero-axis crossing for moving a shield into the path of the vapor.

The regulating procedure in accordance with the present invention also permits operation of the associated evaporation device by personnel without scientific background without increasing the rejection rate.

Continuous measurement of the reflection or transmission behavior of an optical layer, especially with the use of monochromatic light, leads to measurement values which behave as a function of time in such a way, that, for example, the reflection of the layer up to a thickness of one quarter wavelength of the light used for measurement first decreases, then increases up to a layer thickness of half a wavelength to the initial value, and then decreases again up to a layer thickness of three-quarter wavelength, and so on. The development of such a test curve is described in detail in German disclosure DT-AS No. 1,214,970. However, the use of such test results for the regulation, control and influencing of $\lambda/8$ layer thicknesses encounters difficulties. The reason is, that the curve for $\lambda/8$ layers has very flat maximums and minimums, and therefore an exact timewise limitation of the evaporation processes at the maximums and minimums is not possible. However, by forming the second derivative with respect to time, the curve at the maximums and minimums has a zero-axis crossing which can be used to great advantage for power-shutoff and control purposes. The zero-axis crossing can be used for the precise termination of the evaporation process for each individual layer.

An arrangement for carrying out the regulating procedure, in accordance with the present invention, comprises an evaporator located inside a vacuum chamber and an associated substrate holder, and a device for continuously measuring and differentiating the optical behavior of the layer during its build-up. As further provided in the present invention, a second device for forming the second derivative is series-connected with the first differentiating device. The output of the first differentiating device is connected to a comparator and a final control element to influence the evaporator power. Alternatively, with the above arrangement, the output of the comparator may be connected to a final control element for a shield or aperture which can be moved into the path of the vapor. Ordinarily, a nominal value function generator (hereinafter called nominal value generator) is connected to the comparator. The nominal value generator is constructed of a suitable choice of electrical and/or mechanical elements. The waveform of the output signal is determined on the basis of the above-described theoretical considerations. From this, the transmission and reflection vary, as the layer grows, according to a sine curve. The time derivative varies according to a cosine curve, and the second derivative varies again according to a sine curve. The timewise behavior of the curve can be determined empirically by statistical investigations and analyses during and/or after the production of optically active layers. For the passage of a half-wave, i.e., the buildup of a layer thickness of one-eighth the wavelength of the light used, a time interval of a few minutes is required.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

A schematic view of the essential components for carrying out the vapor deposition process, together with the controlling elements therefore, and their interconnection in accordance with the present invention.

DESCRIPTION OF THE PREFERRED EMBODIMENT

Referring to the drawing, reference numeral 10 denotes substrates (optical lenses) on which the layer to be evaporated is deposited. The substrates are fastened by means of claws (not shown) in a holding device 12 comprising a spherical dish 13 with suitable recesses and a rod 14 whose height can be adjusted. Below subsrate 10 is a so-called thermic evaporator 15 for evaporating the evaporation material. Evaporator 15 rests on two studs 16 and 17. These studs simultaneously serve as current carriers and pass, via vacuum insulators 19 and 20, through a base plate 18. The above components are surrounded by a vacuum-tight bell jar which rests on the base plate 18 with ring gasket 22 in between. A vacuum of $2 \times 10^{-5}$ torr, sufficient for the evaporation process, is achieved by means of a pumping device connected to the base plate via a pipe line 23.

The heater current for evaporator 15 is furnished by a current source which is connected via the connecting terminals 24 to a power transformer 25. To the power transformer 25, furthermore, is connected a transformer 26 with which the heater voltage is dropped down to a value which results in the required heater power, taking into account the given electrical conductivity of evaporator 15.

In addition to the components already mentioned, the bell jar contains a light source 40 surrounded by a housing. This light source emits a bunched light beam 41. The light beam hits one of substrates 10 and is there resolved into a reflected component 41a and a transmitted component 41b. The reflected component 41a is delivered to a photoreceiver 42 and the transmitted component 41b is delivered to a photoreceiver 43. It is possible to use the measured value of both the one or the other photoreceiver for the evaluation, as well as the combined output signals of both photoreceivers, e.g., for the purpose of forming the difference in order to determine the absorption. The outputs of photoreceivers 42 and 43 are connected via lines 44 or 45, respectively to an amplifier 46. They are then connected via a line 47 to a differentiating unit 48 in which the first derivative of the measured values is formed.

The output of the first differentiating unit 48 is connected, via a line 49, to a second device 50 for the formation of the second derivative. In addition, the output of the first device 48 is connected, via line 51, to a comparator 52 to which a nominal-value function generator 53 is connected by way of a line 54. In addition, a program transmitter 56 can be connected via line 55 to the comparator 52. This program transmitter automatically regulates or controls, for example, the start of the evaporation process. The devices 48 and 50 for the formation of the first and second derivatives may, in their simplest form, be RC-units.

The output of the comparator 52 is connected via line 57 to a final control element 37 which may be a servomotor coupled via an adjustment shaft 38 to the shifter or adjuster of the power transformer 25 for the evaporator 15.

The second differentiating device is connected via a line 58, 60 to a final control element 61 which drives a disk-like shield 63 by means of an actuating shaft 62. By means of this shield, the evaporator 15 can be completely covered. When a suitable switching pulse develops in the program transmitter 56, a signal is transmitted via line 58a (represented by a dashed line) to the final control element 61, as a result, an opening is left by element 63 so that the actual evaporation process can start.

The mode of operation of the arrangement is as follows: After loading the evaporator 15 and the substrate holder 12, and after evacuating the bell jar, element 63 is still in closed position. On the basis of the fixed power program provided by program transmitter 56, the power of the evaporator 15 is adjusted to the proper value. The programming proceeds in such a way that a preheating and melting of the evaporation material is assured. As soon as the switching pulse is formed in the program transmitter 56, element 63 moves into open position so that the evaporation process starts. As soon as, because of the above-described circuit arrangement, a zero-axis crossing appears at the output of the second device for forming the second derivative, 50, i.e., in line 51 on the basis of the comparison in comparator 52, there takes place either a spontaneous interruption of power to the evaporator 15 via line 57 and the final control element 37, or the power transformer 25 and/or via the line 58, the final control element 61 due to the complete covering of the evaporator 15 by shield 63. Since zero-axis crossing occurs exactly upon completion of a layer of thickness $\lambda/8$, exact maintenance of the desired layer thickness is assured.

In the arrangement shown, a switch 65 is placed in line 58, so that the arrangement functions in the manner described above. If switch 65 is reset in such a way that it makes contact with line 66 and hence to the first differentiating unit 48, the same arrangement can be used for control when building up $\lambda/4$-layers.

Without further analysis, the foregoing will so fully reveal the gist of the present invention that other can, by applying current knowledge, readily adapt it for various applications without omitting features that, from the standpoint of prior art, fairly constitute essential characteristics of the generic or specific aspects of this invention, and therefore, such adaptations should and are intended to be comprehended within the meaning and range of equivalence of the following claims.

I claim:

1. A method for regulating the vapor deposited layer build-up in the production of deposited optically active thin layers on substrates in a vacuum comprising the steps of: measuring continuously the optical characteristics of the deposited layer; converting the optical characteristics into proportional electrical signals; differentiating said signals twice to obtain the second derivative; deriving the zero-axis crossings of said signals from said second derivative; and interrupting the deposition of said layers dependent on said zero-axis crossing, whereby a first of the differentiating signals controls the buildup of $\lambda/4$ layers and a second of the differentiating signals controls the buildup of the $\lambda/8$ layers.

2. The method as defined in claim 1 wherein the energy supplied for said vapor deposited layers is interrupted dependent on said zero-axis crossings.

3. The method as defined in claim 1 wherein said interrupting is effected by the step of inserting shielding means in the vapor path for said vapor deposited layers.

4. An arrangement for regulating the vapor deposited layer build-up in the production of deposited optically active thin layers on substrates in a vacuum comprising a vacuum chamber; evaporator means in said vacuum chamber; means for supplying power to said evaporator means; means for controlling the power of said evaporator means; substrate holding means in said vacuum chamber; means for continuously measuring the optical characteristics of the vapor deposited layer during build-up; means for converting the measured optical characteristics into proportional electrical signals, first differentiating means for differentiating said signals, second differentiating means connected in series with said first differentiating means for differentiating said signals a second time, the second derivative providing the zero-axis crossings of said signals; comparator means having one input connected to said first differentiating means and another input connected to a nominal value function generator for producing a waveform signal independent from the optical characteristics of the deposited layer and corresponding to the desired change of the optical characteristics; control means connected to the output of said comparator means for varying the evaporator power; shield means connected to said second differentiating means for covering the evaporator means on said zero-axis crossings; and switch means between said first differentiating means and said second differentiating means, said switch means connecting selectively said control means to said first differentiating means to control the build-up of $\lambda/4$ layers and to said second differentiating means to control the build-up of $\lambda/8$ layers.

* * * * *